(12) United States Patent
Liang et al.

(10) Patent No.: US 10,996,262 B2
(45) Date of Patent: May 4, 2021

(54) RELIABILITY DETERMINATION METHOD

(71) Applicant: Vanguard International Semiconductor Corporation, Hsinchu (TW)

(72) Inventors: Sheng-Hui Liang, Taipei (TW); Huang-Lang Pai, Hsinchu (TW); Chia-Ming Hsu, Taichung (TW); Chia-Lin Chen, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 129 days.

(21) Appl. No.: 16/398,883

(22) Filed: Apr. 30, 2019

(65) Prior Publication Data

US 2020/0348355 A1 Nov. 5, 2020

(51) Int. Cl.
*G01R 31/26* (2020.01)
*H01L 21/00* (2006.01)
*G05B 1/00* (2006.01)

(52) U.S. Cl.
CPC .............................. *G01R 31/2642* (2013.01)

(58) Field of Classification Search
CPC ....... H01L 21/00; H01L 2221/00; G05B 1/00; G05B 2219/00; G01M 1/00
See application file for complete search history.

(56) References Cited

U.S. PATENT DOCUMENTS

| | | | |
|---|---|---|---|
| 6,633,177 | B1 | 10/2003 | Okada |
| 6,797,323 | B1* | 9/2004 | Kashiwagi ........ H01L 21/02255 427/255.29 |
| 2007/0032973 | A1 | 2/2007 | Chien et al. |
| 2007/0185683 | A1* | 8/2007 | Foo .................. G05B 19/41875 702/181 |
| 2008/0309365 | A1* | 12/2008 | Liao .................. G01R 31/2858 324/762.09 |

(Continued)

FOREIGN PATENT DOCUMENTS

| | | |
|---|---|---|
| CN | 102221668 A | 10/2011 |
| CN | 102289531 A | 12/2011 |
| CN | 104182563 A | 12/2014 |

OTHER PUBLICATIONS

Taiwanese Office Action and Search Report, dated Jul. 26, 2019, for Taiwanese Application No. 108100010.

*Primary Examiner* — Jermele M Hollington
*Assistant Examiner* — Temilade S Rhodes-Vivour
(74) *Attorney, Agent, or Firm* — Birch, Stewart, Kolasch & Birch LLP

(57) ABSTRACT

A reliability determination method, which is configured to test a batch of semiconductor devices, includes: obtaining a Welbull distribution of lifetime of the batch of semiconductor devices; dividing the Welbull distribution into at least a first section and a second section, wherein the first section and the second section meet a confidence interval; generating a first trend line of the first section and a second trend line of the second section according to the first confidence level, in which the first trend line has a first slope and the second trend line has a second slope; determining the first slope exceeds a second slope; and determining a predicted reliability of the batch of the semiconductor device under a target quality level according to the first section.

12 Claims, 7 Drawing Sheets

(56) References Cited

U.S. PATENT DOCUMENTS

| | | | |
|---|---|---|---|
| 2012/0187974 A1* | 7/2012 | Brochu, Jr. | G01R 31/2623 |
| | | | 324/762.01 |
| 2015/0007662 A1* | 1/2015 | Murphy | G01M 7/027 |
| | | | 73/663 |
| 2015/0100284 A1* | 4/2015 | Teravainen | G06F 30/20 |
| | | | 703/2 |

* cited by examiner

RELIABILITY DETERMINATION METHOD

BACKGROUND OF THE INVENTION

Field of the Invention

The disclosure relates generally to a semiconductor device, and more specifically it relates to a reliability determination method for determining the reliability of a semiconductor device.

Description of the Related Art

The method of global fitting is mostly configured to predict the reliability. In order to reduce the testing cost, the number of samples that are executed the reliability test is usually limited. For example, the number of samples is several hundred for predicting the 1 ppm lifetime of a semiconductor device. Therefore, the method of global fitting with limited number of samples seems to be too conservative to predict the reliability under a target quality level such that it takes a lot of manufacturing cost to improve the reliability. If the number of samples that are executed the reliability test is increased, the cost of testing the reliability should be significantly increased. Therefore, we need a more efficient reliability determination method.

BRIEF SUMMARY OF THE INVENTION

In an embodiment, a reliability determination method for testing a batch of a semiconductor device is provided. The reliability determination method comprises: obtaining a Weibull distribution of a lifetime of the batch of the semiconductor device; dividing the Weibull distribution into a first section and a second section, wherein the first section and the second section meets a first confidence level; generating a first trend line of the first section and a second trend line of the second section according to the first confidence level, wherein the first trend line has a first slope and the second trend line has a second slope; determining that the first slope of the first section exceeds the second slope of the second section; and determining a predicted reliability of the batch of the semiconductor device under a target quality level according to the first section.

According to an embodiment of the invention, the step of determining the predicted reliability of the batch of the semiconductor device under the target quality level according to the first section further comprises: extrapolating the target quality level from the first section to obtain the predicted reliability.

According to an embodiment of the invention, the step of obtaining the Weibull distribution of the lifetime of the batch of the semiconductor device comprises: obtaining a breakdown voltage; applying a stress voltage to an insulating layer of the batch of the semiconductor and measuring a stress current of the insulating layer, wherein the stress voltage is less than the breakdown voltage and exceeds a normal voltage; applying the normal voltage to the insulating layer of the batch of the semiconductor device and measuring a normal current of the insulating layer; comparing the stress current with the normal current to determine a lifetime distribution of the semiconductor device; and obtaining the Weibull distribution according to the lifetime distribution.

According to an embodiment of the invention, the insulating layer is an insulating layer of a front-end-of-line, a middle-end-of-line, and/or a back-end-of-line.

According to an embodiment of the invention, the reliability determination method further comprises: expanding, according to the first confidence level, a first sampled number of the first section to a predetermined number as a first expanded section; and expanding, according to the first confidence level, a second sampled number of the second section to the predetermined number as a second expanded section, wherein the predetermined number relates to the target quality level.

According to an embodiment of the invention, the reliability determination method further comprises: combining the first expanded section with the second expanded section to generate an expanded Weibull distribution; dividing the expanded Weibull distribution into at least a first simulated section and a second simulated section, wherein the first simulated section and the second simulated section meet a second confidence interval, wherein the first simulated section has a first simulated trend line and the second simulated section has a second simulated trend line, wherein the first simulated trend line has a first simulated slope and the second simulated trend line has a second simulated slop; determining that the first simulated slope of the first simulated section exceeds the second simulated slope of the second simulated section; and determining the predicted reliability of the batch of the semiconductor device under the target quality level according to the first simulated section.

In an embodiment, a storage device accessible to a machine and storing an instruction program is provided. The machine executes the instruction program to perform a reliability determination method. The reliability determination method is configured to test a batch of a semiconductor device, which comprises: obtaining a Weibull distribution of a lifetime of the batch of the semiconductor device; dividing the Weibull distribution into a first section and a second section, wherein the first section and the second section meets a first confidence level; generating a first trend line of the first section and a second trend line of the second section according to the first confidence level, wherein the first trend line has a first slope and the second trend line has a second slope; determining that the first slope of the first section exceeds the second slope of the second section; and determining a predicted reliability of the batch of the semiconductor device under a target quality level according to the first section.

According to an embodiment of the invention, the step of determining the predicted reliability of the batch of the semiconductor device under the target quality level according to the first section in the reliability determination method further comprises: extrapolating the target quality level from the first section to obtain the predicted reliability.

According to an embodiment of the invention, the step of obtaining the Weibull distribution of the lifetime of the batch of the semiconductor device of the reliability determination method comprises: obtaining a breakdown voltage; applying a stress voltage to an insulating layer of the batch of the semiconductor and measuring a stress current of the insulating layer, wherein the stress voltage is less than the breakdown voltage and exceeds a normal voltage; applying the normal voltage to the insulating layer of the batch of the semiconductor device and measuring a normal current of the insulating layer; comparing the stress current with the normal current to determine a lifetime distribution of the semiconductor device; and obtaining the Weibull distribution according to the lifetime distribution.

According to an embodiment of the invention, the insulating layer is an insulating layer of a front-end-of-line, a middle-end-of-line, and/or a back-end-of-line.

According to an embodiment of the invention, the reliability determination method further comprises: expanding, according to the first confidence level, a first sampled number of the first section to a predetermined number as a first expanded section; and expanding, according to the first confidence level, a second sampled number of the second section to the predetermined number as a second expanded section, wherein the predetermined number relates to the target quality level.

According to an embodiment of the invention, the reliability determination method further comprises: combining the first expanded section with the second expanded section to generate an expanded Weibull distribution; dividing the expanded Weibull distribution into at least a first simulated section and a second simulated section, wherein the first simulated section and the second simulated section meet a second confidence interval, wherein the first simulated section has a first simulated trend line and the second simulated section has a second simulated trend line, wherein the first simulated trend line has a first simulated slope and the second simulated trend line has a second simulated slop; determining that the first simulated slope of the first simulated section exceeds the second simulated slope of the second simulated section; and determining the predicted reliability of the batch of the semiconductor device under the target quality level according to the first simulated section.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
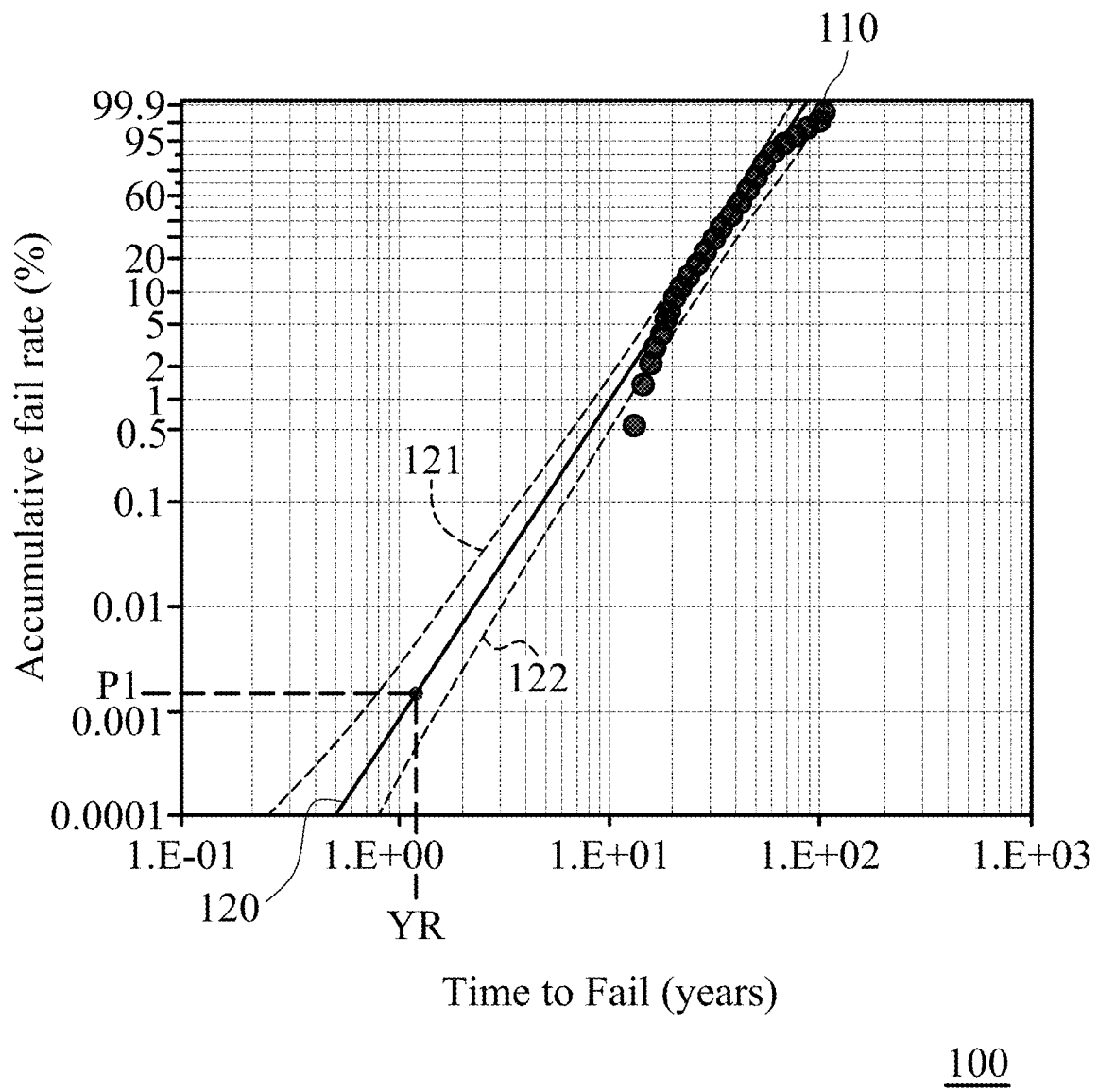
FIG. 1 is a curve diagram of an accelerated life test in accordance with an embodiment of the invention.

This description is made for the purpose of illustrating the general principles of the invention and should not be taken in a limiting sense. In addition, the present disclosure may repeat reference numerals and/or letters in the various examples. This repetition is for the purpose of simplicity and clarity and does not in itself dictate a relationship between the various embodiments and/or configurations discussed. The scope of the invention is best determined by reference to the appended claims.

It is understood that the following disclosure provides many different embodiments, or examples, for implementing different features of the application. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact.

FIG. 1 is a curve diagram of an accelerated life test in accordance with an embodiment of the invention. As shown in FIG. 1, the X-axis of the curve diagram 100 indicates the life (the unit is year), and the Y-axis indicates the cumulative fail rate (the unit is "%"). According to an embodiment of the invention, a predetermined batch of semiconductor device are sampled, and the lifetime of the semiconductor device is calculated by using an accelerated testing method, such as shortening the testing time for testing the lifetime of the semiconductor by rising the temperature and/or the voltage, and equations with the predetermined batch of semiconductor device. When the lifetimes of the predetermined batch of semiconductor device are obtained, and the measured data 110 is painted out. According to an embodiment of the invention, the measured data 110 is a Weibull distribution.

According to an embodiment of the invention, when the lifetime of the semiconductor is predicted by the measured data 110 with the predetermined batch, a method of global fitting is utilized to find out a trend line 120 of the measured data 110. It is determined that a probability of the lifetime of the semiconductor device being not less than a predetermined year YR is a first probability P1 according to the trend line 120 with extrapolation.

According to an embodiment of the invention, the trend line 120 meets a first confidence level and is in the confidence interval between an upper bond 121 and a lower bond 122. According to an embodiment of the invention, the tester may determine the first confidence level himself.

Since the number of the predetermined batch is less, the lifetime of the semiconductor device predicted by the trend line 120 could be conservative. Therefore, the reliability determination method should be improved.

Figure 2:
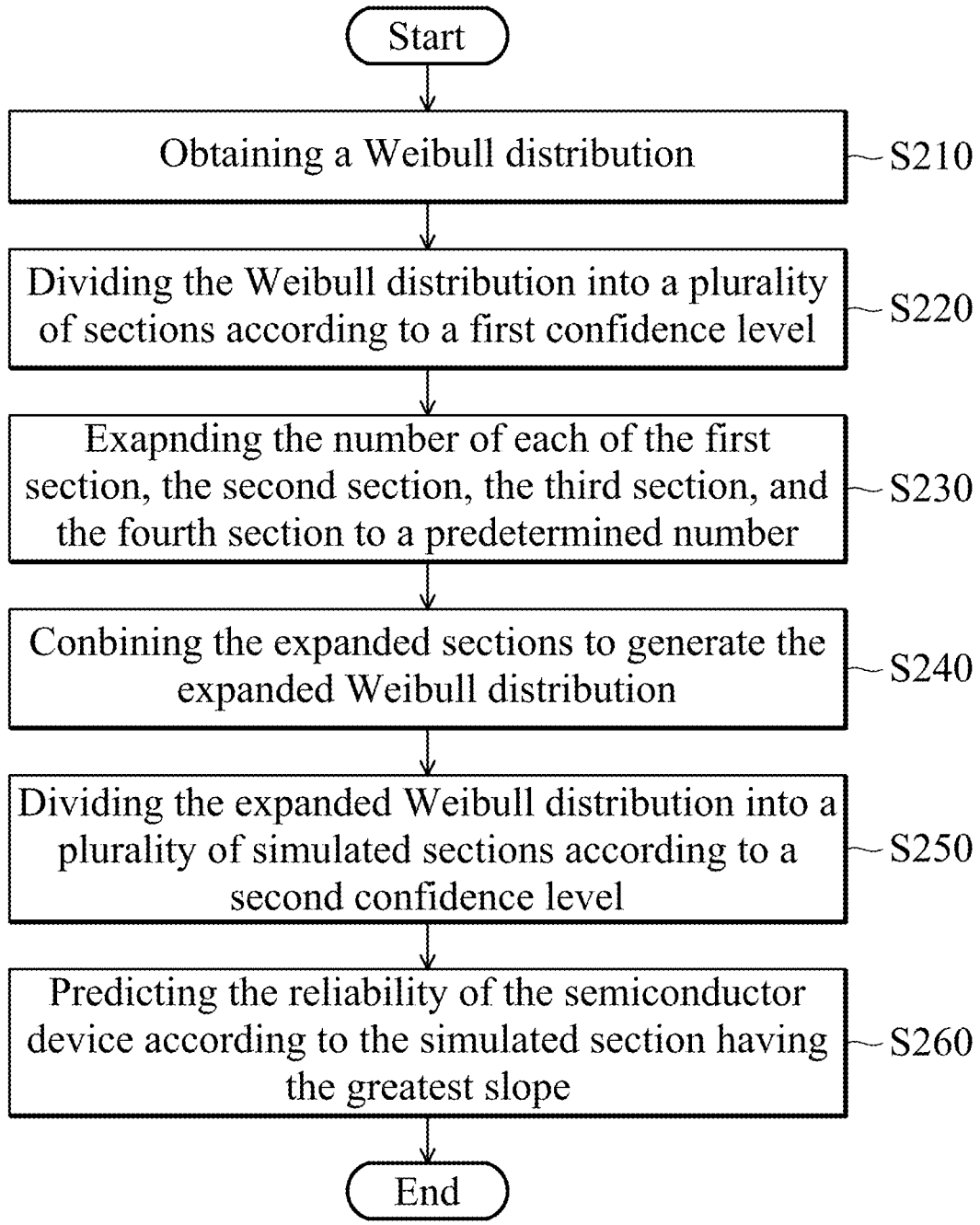
FIG. 2 is a flow chart of a reliability determination method in accordance with another embodiment of the invention.

FIG. 2 is a flow chart of a reliability determination method in accordance with another embodiment of the invention. First, a Weibull distribution of the lifetime of the semiconductor is obtained (Step S210), and the Weibull distribution is divided into several sections (Step S220).

Figure 3A:
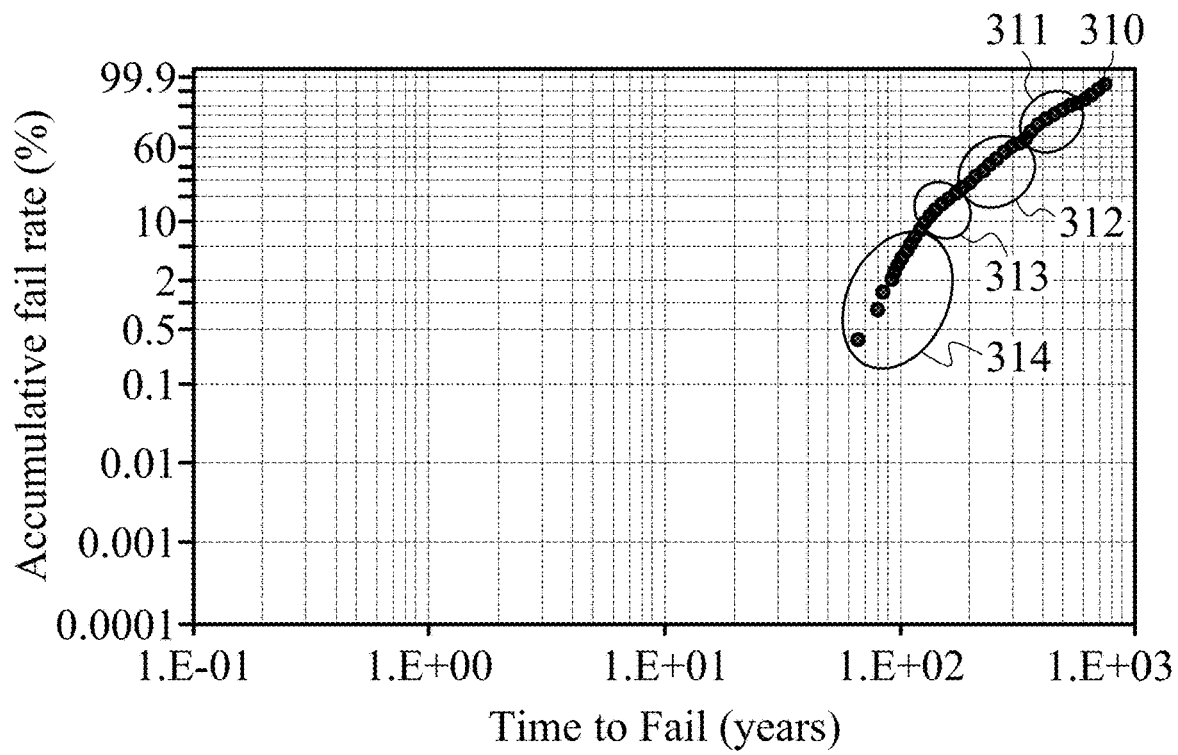
FIGS. 3A-3D are curve diagrams of an accelerated life test in accordance with another embodiment of the invention.

FIGS. 3A-3D are curve diagrams of an accelerated life test in accordance with another embodiment of the invention. As shown in FIG. 3A, the measured data 310 corresponds to the measured data 110 in FIG. 1, which indicates the Weibull distribution of the lifetime of the predetermined batch of the semiconductor device. As shown in FIG. 3A, the measured data 310 is divided into a first section 311, a second section 312, a third section 313, and a fourth section 314 as FIG. 3B.

According to an embodiment of the invention, the measured data 310 is divided into, according to the first confidence level, the first section 311, the second section 312, the third section 313, and the fourth section 314. According to an embodiment of the invention, the first confidence level exceeds 90%. According to other embodiments of the invention, the first confidence level may be determined by the tester, which is not intended to be limited thereto. According to other embodiments of the invention, the measured data 310 may be divided into several sections according to the first confidence level. Only four sections are illustrated herein, but not intended to be limited thereto.

Figure 3B:
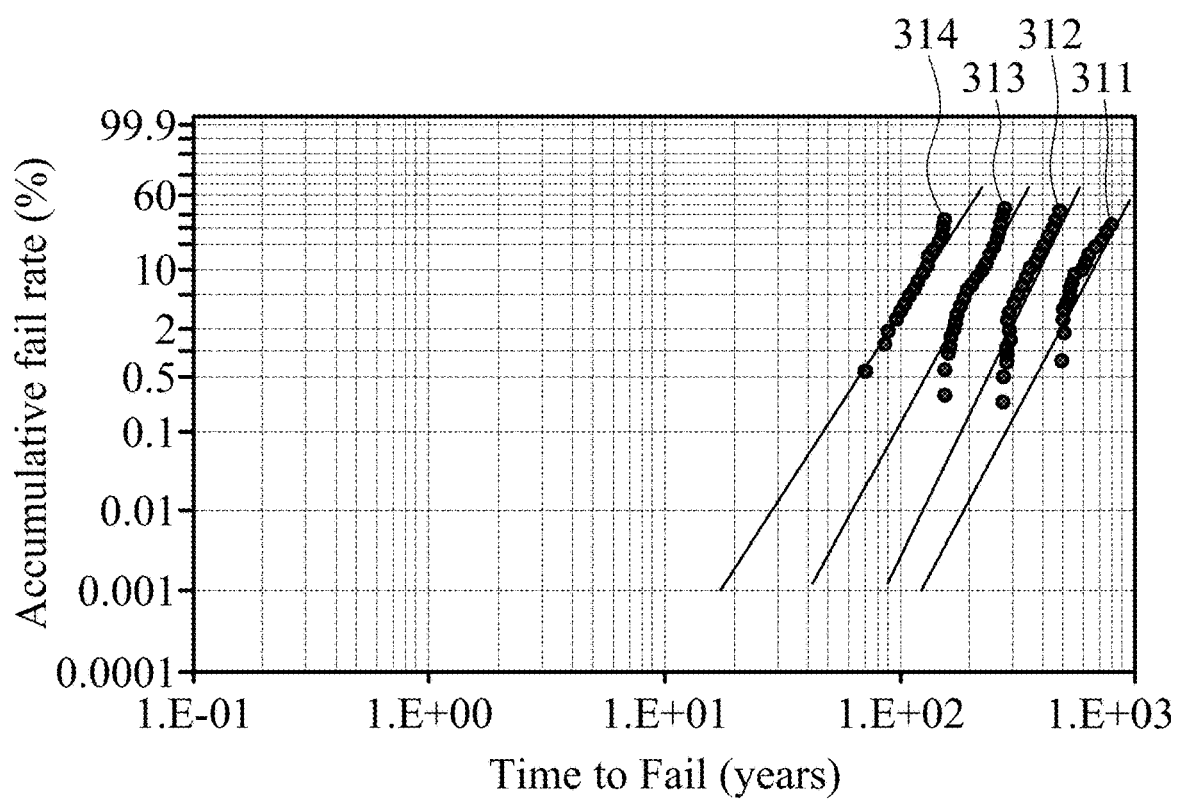

Back to the Step S220 in FIG. 2, when the measured data 310 is divided into the first section 311, the second section 312, the third section 313, and the fourth section 314 in FIG. 3B, the number of each of the first section 311, the second section 312, the third section 313, and the fourth section 314 is expanded to a predetermined number (Step S230).

Figure 3C:
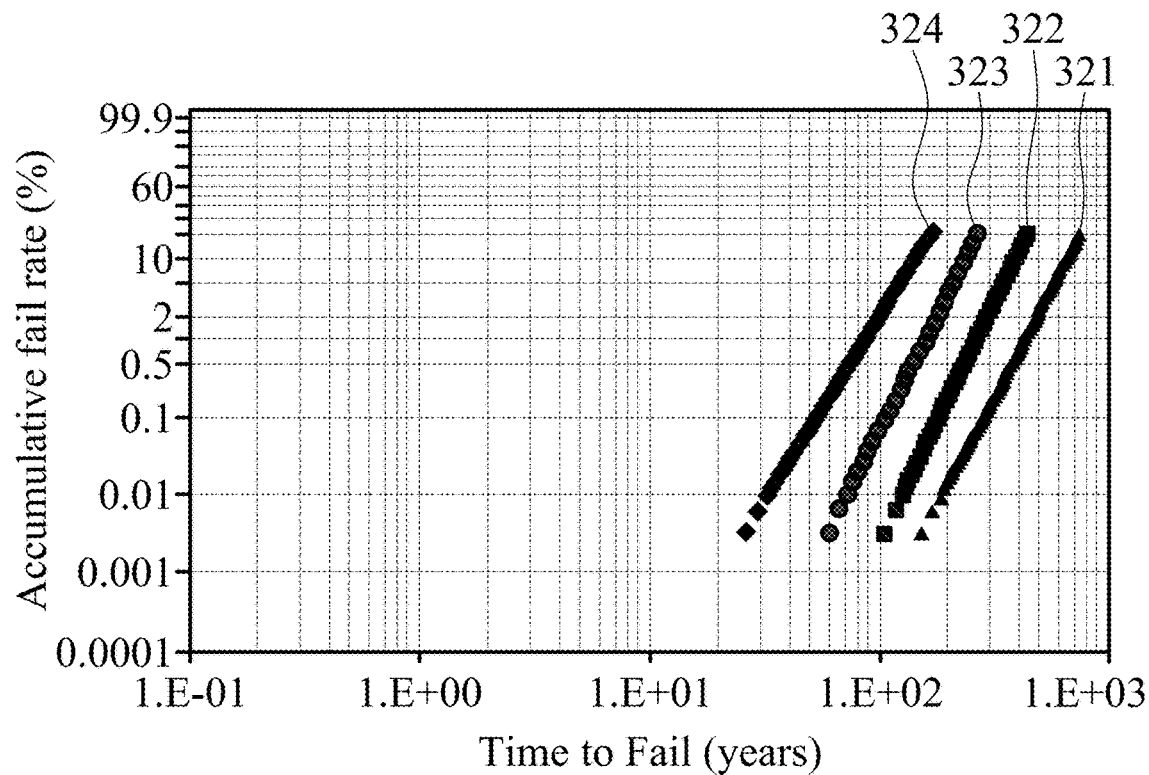

Namely, the first section 311, the second section 312, the third section 313, and the fourth section 314 in FIG. 3B are expanded to be a first expanded section 321, a second expanded section 322, a third expanded section 323, and a fourth expanded section 324 in FIG. 3C.

For example, when the target quality level is 1 ppm, the total sampled number of the first section 311, the second section 312, the third section 313, and the fourth section 314 are at least expanded to the level of 1 hundred thousand which is close to the order of magnitude that 1 ppm is required. For example, it is assumed that the ratios of the sampled numbers of the first section 311, the second section 312, the third section 313, and the fourth section 314 to the total sampled number are 10%, 40%, 35%, and 15% respectively. Therefore, the sampled numbers of the first section 311, the second section 312, the third section 313, and the fourth section 314 are 10 thousand, 40 thousand, 35 thousand, and 15 thousand. The description above is merely illustrated but not intended to be limited thereto.

Figure 3D:
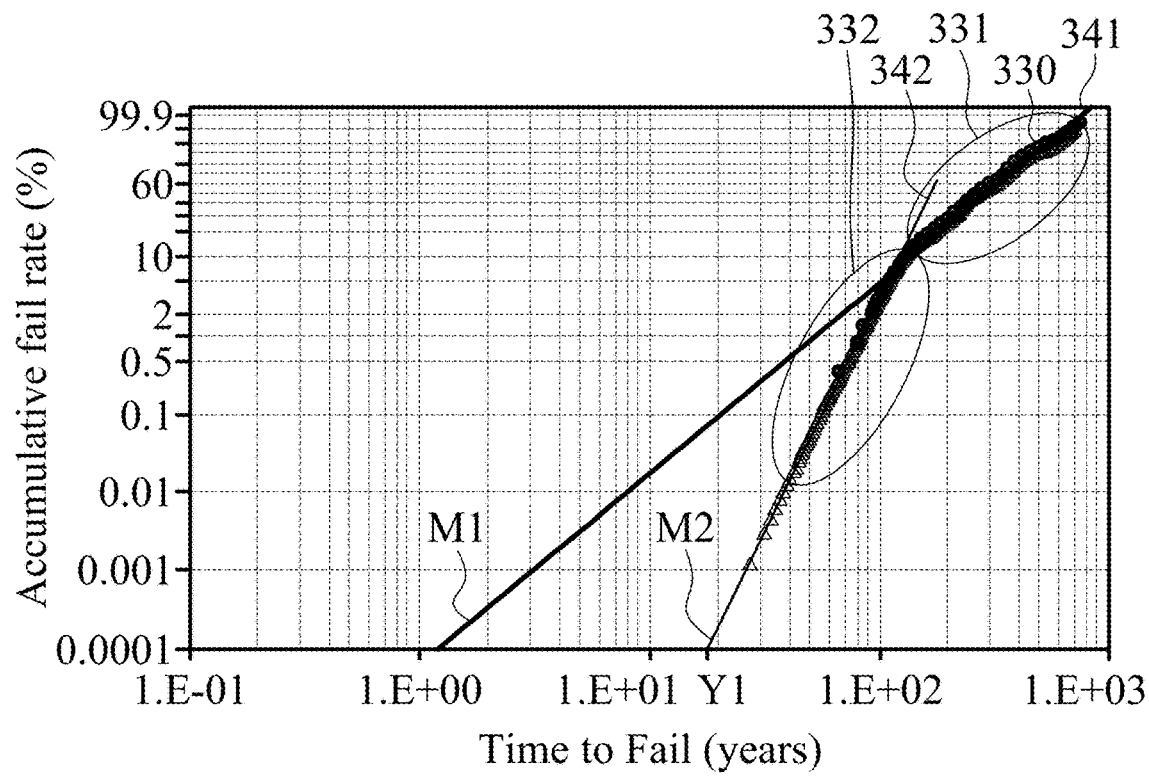

Back to Step S230, the first expanded section 321, the second expanded section 322, the third expanded section 323, and the fourth expanded section 324 in FIG. 3C are combined to be the expanded Weibull distribution 330 as shown in FIG. 3D (Step S240). In addition, the expanded Weibull distribution 330 is further divided into a plurality of simulated sections according to a second confidence level (Step S250).

According to an embodiment of the invention, the second confidence level is identical to the first confidence level. According to another embodiment of the invention, the second confidence level is different from the first confidence level. For example, the first confidence level is 90%, and the second confidence level is 99%, in order to obtain a more precise trend line.

As shown in FIG. 3D, the expanded Weibull distribution 330 is divided into a first simulated section 331 and a second simulated section 332, in which two simulated sections are illustrated herein but not intended to be limited thereto. In addition, a first simulated trend line 341 is generated from the first simulated section 331 according to the second confidence level, and the second simulated trend line 342 is generated from the second simulated section 332 according to the second confidence level.

Back to Step S250, the reliability of the semiconductor device is predicted according to the simulated section having the greatest slope (Step S260). According to an embodiment of the invention, the reliability indicates that the lifetime of the semiconductor device under the target quality level. As shown in FIG. 3D, the first simulated trend line 341 has a first slope m1, and the second simulated trend line 342 has a second slope m2, in which the second slope m2 exceeds the first slope m1. Therefore, the lifetime of the semiconductor device is predicted according to the second simulated trend line 342.

According to an embodiment of the invention, for example, as shown in FIG. 3D, when the target quality level is 1 ppm (i.e., 0.0001%), the lifetime of the semiconductor device is a first year Y1, which indicates that the probability of the lifetime of the semiconductor device not exceeding the first year Y1 is 1 ppm. According to an embodiment of the invention, when the lifetime of the semiconductor device is predicted according to the second simulated trend line 342, the lifetime under the target quality level is estimated by extrapolating the target quality level from the second simulated trend line 342.

When the method of global fitting in FIG. 1 is utilized to predict the lifetime of the semiconductor device, it is more reasonable that the trend line 120 should correspond to the first simulated trend line 341 in FIG. 3D, such that the lifetime prediction is too conservative. When the sampled number of the measured data 310 is expanded, the tail of the expanded Weibull distribution 330 (i.e., the second simulated section 332) is more significant. Therefore, the lifetime of the semiconductor device under the target quality level can be more precisely predicted by using the second simulated section 332 that has worse lifetime.

According to an embodiment of the invention, the measured data 310 relates to the lifetime of a withstand voltage of the insulating layer in a semiconductor. According to an embodiment of the invention, the insulating layer in a semiconductor device is an insulating layer of front-end-of-line (FEOL). According to another embodiment of the invention, the insulating layer in a semiconductor device is an insulating layer of middle-end-of-line (MEOL). According to another embodiment of the invention, the insulating layer in a semiconductor device is an insulating layer of back-end-of-line (BEOL).

Figure 4:
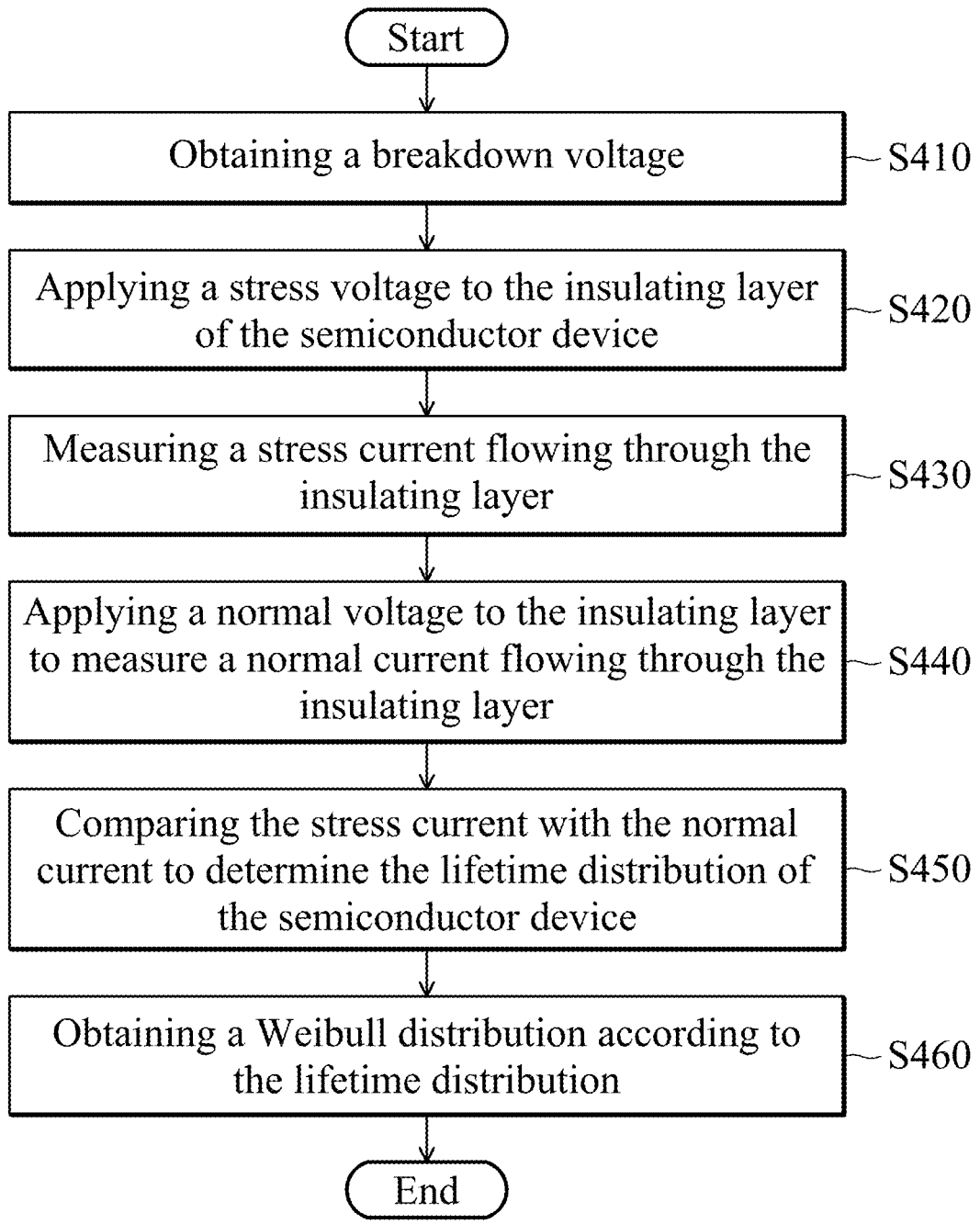
FIG. 4 is a flow chart of a method for obtaining the measured data in accordance with an embodiment of the invention.

FIG. 4 is a flow chart of a method for obtaining the measured data in accordance with an embodiment of the invention. First, the breakdown voltage of the semiconductor device is obtained (Step S410), and a stress voltage is applied to the insulating layer of the semiconductor device (Step S420). The stress voltage is less than the breakdown voltage, and also exceeds a normal voltage that is applied to the insulating layer of the semiconductor device during a normal operation.

Then, the stress current flowing through the insulating layer of the semiconductor device is measured (Step S430). The normal voltage, which is applied to the insulating layer of the semiconductor device during the normal operation, is applied to the insulating layer of the semiconductor device, and the normal current flowing through the insulating layer of the semiconductor device is measured (Step S440).

According to an embodiment of the invention, the normal voltage is the voltage applied to the insulating layer when the semiconductor device operates in a normal operation. When the semiconductor device is executed the accelerated life test, the stress voltage, which exceeds the normal voltage, is applied to the insulating layer in a special environment (i.e., high temperature and/or high pressure), in order to estimate the lifetime of the semiconductor device.

The stress current is compared with the normal current to determine the lifetime distribution of the semiconductor device (Step S450). According to an embodiment of the invention, when the stress current exceeds the normal current by a threshold, it indicates that the semiconductor device has a leakage current after the accelerated lifetime test. Therefore, the semiconductor device is determined to be damaged. According to another embodiment of the invention, when the stress current does not exceed the normal current by the threshold, it indicates that the semiconductor device still operates in stable after the accelerated lifetime test. Therefore, the semiconductor device is determined to be normal.

According to the lifetime distribution obtained in Step S450, the measured data 110 in FIG. 1 or the measured data 310 in FIG. 3 is depicted (Step S460), in which the measured data 110 and the measured data 310 are Weibull distribution.

According to other embodiments of the invention, the measured data 310 may relate to the lifetime of other parameters of the semiconductor device and the lifetime of any other electrical parameters of the semiconductor device. The lifetime of the insulating layer of the semiconductor device stated above is merely illustrated, but not intended to be limited thereto.

Figure 5:
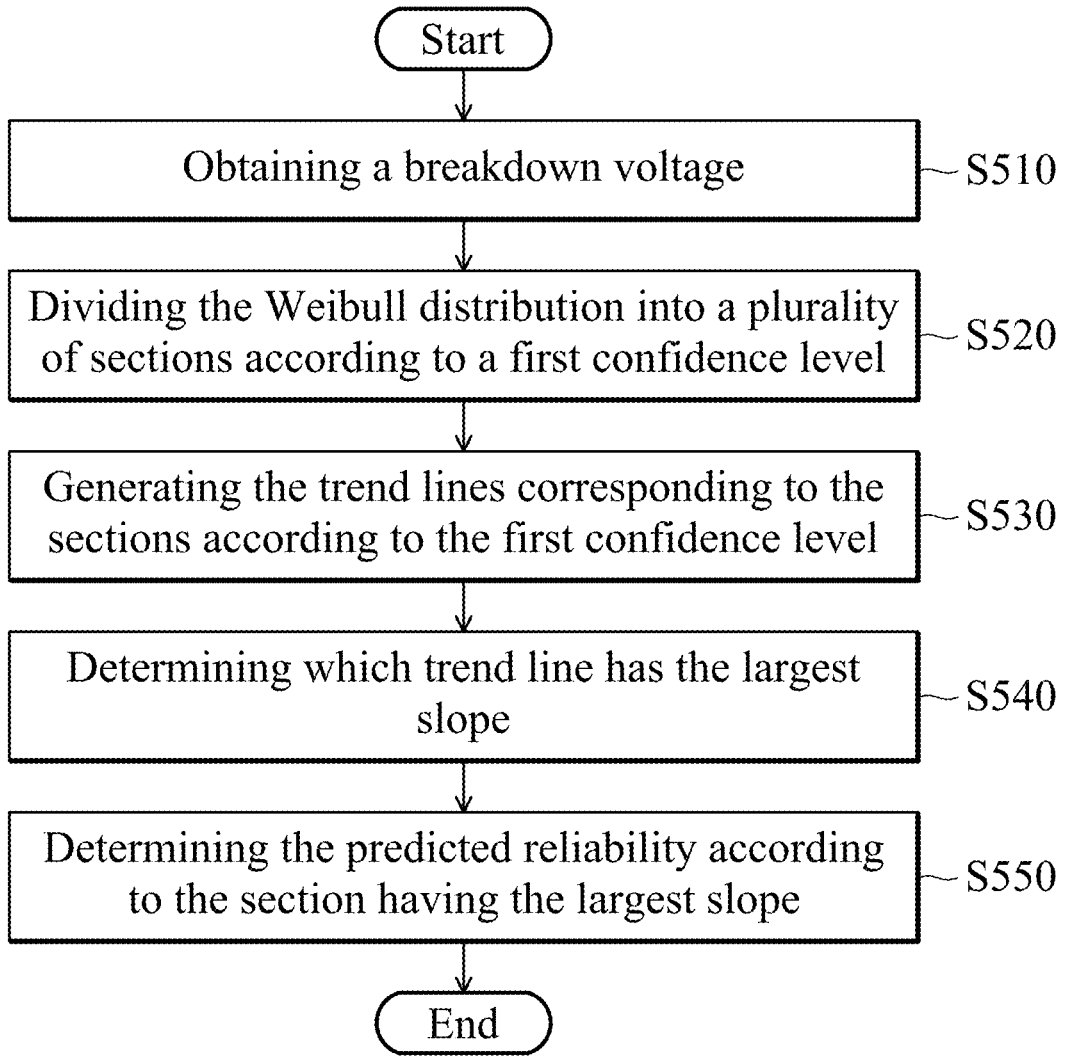
FIG. 5 is a flow chart of a reliability determination method in in accordance with another embodiment of the invention.

FIG. 5 is a flow chart of a reliability determination method in in accordance with another embodiment of the invention. As shown in FIG. 5, the Weibull distribution of the lifetime of the semiconductor device is obtained (Step S510). The Weibull distribution is divided into a plurality of sections according to the first confidence level (Step S520).

Figure 6:
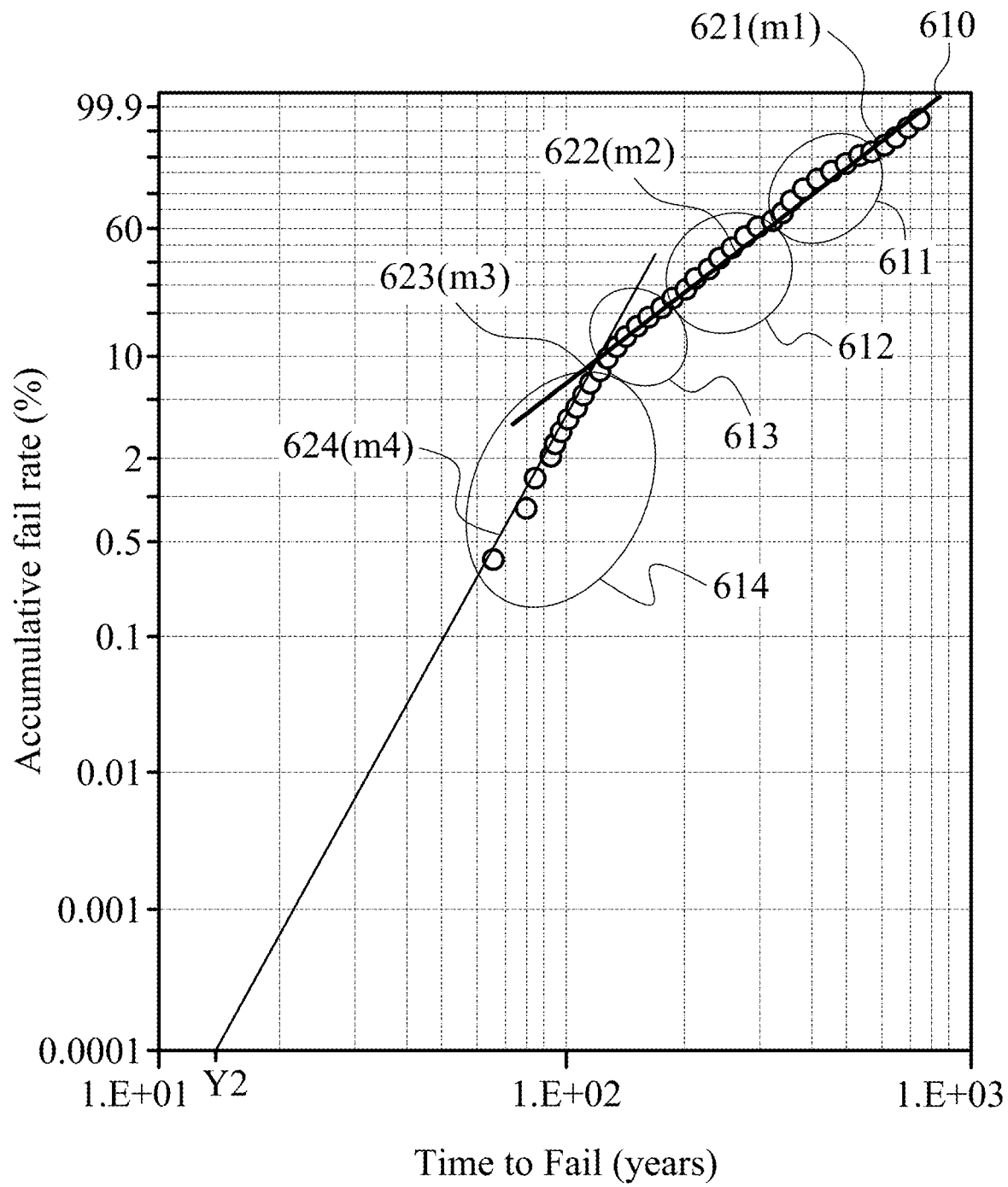
FIG. 6 is a curve diagram of an accelerated life test in accordance with another embodiment of the invention.

FIG. 6 is a curve diagram of an accelerated life test in accordance with another embodiment of the invention. According to an embodiment of the invention, the measured data 610 corresponds to the measured data 310. As shown in FIG. 6, Step S510 is configured to obtain the measured data 610. The measured data 610 is divided into a first section 611, a second section 612, a third section 613, and a fourth section 614 according to the first confidence level in Step S520.

In Step S530, a first trend line 621, a second trend line 622, a third trend line 623, and a fourth trend line 624, which correspond to the first section 611, the second section 612, the third section 613, and the fourth section 614 respectively, are generated according to the first confidence level. As shown in FIG. 6, the first trend line 621 has a first slope m1, the second trend line 622 has a second slope m2, the third trend line 623 has a third slope m3, and the fourth trend line 624 has a fourth slope m4.

Then, it is determined that whether the first slope m1, the second slope m2, the third slope m3, or the fourth slope m4 is the largest (Step S540). The predicted reliability of the semiconductor device is determined by the one having the largest slope among of the first trend line 621, the second trend line 622, the third trend line 623, and the fourth trend line 624 (Step S550). According to an embodiment of the invention, since the fourth slope m4 of the fourth trend line 624 is the largest, the fourth trend line 624 is utilized to predict the lifetime of the semiconductor device under the target quality level, and the lifetime is equivalent to the predicted reliability of the semiconductor device.

According to an embodiment of the invention, it is assumed that the target quality level is 0.0001% (i.e., 1 ppm). The lifetime of the semiconductor device under the target quality level is the second year Y2 according to the fourth trend line 624.

The invention provides a reliability determination method such that the reliability of the semiconductor device is much closer to the real situation of the product, the determination of the reliability of the product is much simpler, and the manufacturing cost is therefore reduced.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A reliability determination method for testing a batch of a semiconductor device, comprising:
    obtaining a Weibull distribution of a lifetime of the batch of the semiconductor device;
    dividing the Weibull distribution into a first section and a second section, wherein the first section and the second section meet a first confidence level;
    generating a first trend line of the first section and a second trend line of the second section according to the first confidence level, wherein the first trend line has a first slope and the second trend line has a second slope;
    determining that the first slope of the first section exceeds the second slope of the second section; and
    determining a predicted reliability of the batch of the semiconductor device under a target quality level according to the first section.

2. The reliability determination method of claim 1, wherein the step of determining the predicted reliability of the batch of the semiconductor device under the target quality level according to the first section further comprises:
    extrapolating the target quality level from the first section to obtain the predicted reliability.

3. The reliability determination method of claim 1, wherein the step of obtaining the Weibull distribution of the lifetime of the batch of the semiconductor device comprises:
    obtaining a breakdown voltage;
    applying a stress voltage to an insulating layer of the batch of the semiconductor and measuring a stress current of the insulating layer, wherein the stress voltage is less than the breakdown voltage and exceeds a normal voltage;
    applying the normal voltage to the insulating layer of the batch of the semiconductor device and measuring a normal current of the insulating layer;
    comparing the stress current with the normal current to determine a lifetime distribution of the semiconductor device; and
    obtaining the Weibull distribution according to the lifetime distribution.

4. The reliability determination method of claim 3, wherein the insulating layer is an insulating layer of a front-end-of-line, a middle-end-of-line, and/or a back-end-of-line.

5. The reliability determination method of claim 1, further comprising:
    expanding, according to the first confidence level, a first sampled number of the first section to a predetermined number as a first expanded section; and
    expanding, according to the first confidence level, a second sampled number of the second section to the predetermined number as a second expanded section, wherein the predetermined number relates to the target quality level.

6. The reliability determination method of claim 5, further comprising:
    combining the first expanded section with the second expanded section to generate an expanded Weibull distribution;
    dividing the expanded Weibull distribution into at least a first simulated section and a second simulated section, wherein the first simulated section and the second simulated section meet a second confidence interval, wherein the first simulated section has a first simulated trend line and the second simulated section has a second simulated trend line, wherein the first simulated trend line has a first simulated slope and the second simulated trend line has a second simulated slop;

determining that the first simulated slope of the first simulated section exceeds the second simulated slope of the second simulated section; and determining the predicted reliability of the batch of the semiconductor device under the target quality level according to the first simulated section.

7. A storage device accessible to a machine and storing an instruction program, wherein the machine executes the instruction program to perform a reliability determination method, wherein the reliability determination method is configured to test a batch of a semiconductor device, wherein the reliability determination method comprises:

obtaining a Weibull distribution of a lifetime of the batch of the semiconductor device;

dividing the Weibull distribution into a first section and a second section, wherein the first section and the second section meets a first confidence level;

generating a first trend line of the first section and a second trend line of the second section according to the first confidence level, wherein the first trend line has a first slope and the second trend line has a second slope;

determining that the first slope of the first section exceeds the second slope of the second section; and determining a predicted reliability of the batch of the semiconductor device under a target quality level according to the first section.

8. The storage device of claim 7, wherein the step of determining the predicted reliability of the batch of the semiconductor device under the target quality level according to the first section in the reliability determination method further comprises:

extrapolating the target quality level from the first section to obtain the predicted reliability.

9. The storage device of claim 7, wherein the step of obtaining the Weibull distribution of the lifetime of the batch of the semiconductor device of the reliability determination method comprises:

obtaining a breakdown voltage;

applying a stress voltage to an insulating layer of the batch of the semiconductor and measuring a stress current of the insulating layer, wherein the stress voltage is less than the breakdown voltage and exceeds a normal voltage;

applying the normal voltage to the insulating layer of the batch of the semiconductor device and measuring a normal current of the insulating layer;

comparing the stress current with the normal current to determine a lifetime distribution of the semiconductor device; and obtaining the Weibull distribution according to the lifetime distribution.

10. The storage device of claim 9, wherein the insulating layer is an insulating layer of a front-end-of-line, a middle-end-of-line, and/or a back-end-of-line.

11. The storage device of claim 7, wherein the reliability determination method further comprises:

expanding, according to the first confidence level, a first sampled number of the first section to a predetermined number as a first expanded section; and expanding, according to the first confidence level, a second sampled number of the second section to the predetermined number as a second expanded section, wherein the predetermined number relates to the target quality level.

12. The storage device of claim 11, wherein the reliability determination method further comprises:

combining the first expanded section with the second expanded section to generate an expanded Weibull distribution;

dividing the expanded Weibull distribution into at least a first simulated section and a second simulated section, wherein the first simulated section and the second simulated section meet a second confidence interval, wherein the first simulated section has a first simulated trend line and the second simulated section has a second simulated trend line, wherein the first simulated trend line has a first simulated slope and the second simulated trend line has a second simulated slop;

determining that the first simulated slope of the first simulated section exceeds the second simulated slope of the second simulated section; and determining the predicted reliability of the batch of the semiconductor device under the target quality level according to the first simulated section.

* * * * *